(12) United States Patent
Vaida

(10) Patent No.: US 6,976,198 B1
(45) Date of Patent: Dec. 13, 2005

(54) SELF-REPAIRING INTEGRATED CIRCUIT AND METHOD OF OPERATING THE SAME

(75) Inventor: Theodore F. Vaida, Lafayette, CO (US)

(73) Assignee: LSI Logic Corporation, Milpitas, CA (US)

(*) Notice: Subject to any disclaimer, the term of this patent is extended or adjusted under 35 U.S.C. 154(b) by 621 days.

(21) Appl. No.: 10/002,499

(22) Filed: Nov. 2, 2001

(51) Int. Cl.[7] .................. G01R 31/28; G11C 29/00; G06F 11/00
(52) U.S. Cl. .................. 714/725; 714/733; 714/30; 714/41
(58) Field of Search .................. 714/710, 711, 718, 714/2, 6, 13, 25, 30, 41, 723, 724–727, 732–737; 365/201

(56) References Cited

U.S. PATENT DOCUMENTS 5,659,551 A * 8/1997 Huott et al. ............. 714/725
6,532,579 B2 * 3/2003 Sato et al. ............... 716/8
6,560,740 B1 * 5/2003 Zuraski et al. ........... 714/733
6,691,264 B2 * 2/2004 Huang .................... 714/723

OTHER PUBLICATIONS

"Considerations When Implementing a Design that uses an Arm Hard Macrocell" Mar. 2001 Document No. Arm Dai 0088A.*

* cited by examiner

Primary Examiner—Shelly Chase
Assistant Examiner—Cynthia Britt
(74) Attorney, Agent, or Firm—Hitt Gaines PC

(57) ABSTRACT

An integrated circuit (IC) and methods of manufacturing and operating ICs. In one embodiment, the IC includes: (1) a plurality of interchangeable hard macrocells, (2) at least one programmable logic block (PLB), (3) a bus intercoupling said plurality and said at least one programmable logic block and (4) a self-repair program, associated with said at least one programmable logic block, that causes said PLB to test at least some of said plurality and place at least a functioning one of said plurality into an operational status.

21 Claims, 2 Drawing Sheets

SELF-REPAIRING INTEGRATED CIRCUIT AND METHOD OF OPERATING THE SAME

TECHNICAL FIELD OF THE INVENTION

The present invention is directed, in general, to integrated circuits (ICs) and, more specifically, to a self- repairing very large scale ICs (VLSIs) and wafer-scale ICs (WSIs) and a method of operating such VLSIs or WSIs to achieve self-repair.

BACKGROUND OF THE INVENTION

ICs have become key components of many consumer and commercial electronic products, often replacing discrete components and enhancing functionality. The semiconductor processing technologies that produce these ICs have advanced to the point where complete systems, including memories, can be reduced to a single IC or application-specific IC (ASIC). ASICs are usually made up of standard functional units, called "hard marcrocells" or sometimes "IP blocks," and buses and logic (so-called "glue logic") that tie the hard-macrocells together. It is a common practice for the manufacturers of such ICs to thoroughly test device functionality at the manufacturing site. Because of the increasing complexity of new designs, test development costs now account for a large percentage of the total ASIC development cost.

Before ICs (sometimes called "chips") are released for shipment by a manufacturer, they typically undergo a variety of testing procedures. This testing is necessary because perfect yields are difficult to achieve. It is not uncommon for a certain percentage of unpackaged ASICs to contain hard macrocells that fail testing processes, due largely to non-systemic manufacturing defects and degradation faults. Such manufacturing issues are likely to increase as process geometries continue to shrink and the density of memory cells increases.

A number of ASIC testing strategies have evolved, many of which involve use of an external tester, or Automated Test Equipment (ATE). If the ASIC is accessible from input/output (I/O) pins, either directly or by multiplexing, a hardware test mode can be employed. In this mode, a production test system gains access to the ASIC directly by transmitting signals to, and receiving signals from, the ASIC. While this strategy does not require any chip area other than some simple multiplexing circuitry, it is limited to on-chip memories and other circuitry accessible via I/O pins. Another drawback of this approach is that ATE capabilities are generally not available to end users once the devices have been shipped, making difficult the task of detecting faults occurring after shipment.

If an embedded memory is buried deeply within an ASIC, built-in self-test (BIST) is often considered the most practical and efficient test methodology and is becoming increasing popular with semiconductor vendors. BIST allows the ASIC to be tested quickly with a reasonably high degree of fault coverage, without requiring complex external test equipment and large amounts of external access circuitry. One advantage BIST has over many traditional testing methods is that with BIST, memory or logic circuitry can be tested at any time in the field. This capability offers some degree of continued fault protection.

BIST refers in general to any test technique in which test vectors are generated internal to an IC or ASIC. Test vectors are sequences of signals that are applied to an IC to determine if it is performing as designed. BIST can be used to test circuitry located anywhere on the ASIC without requiring dedicated I/O pins, and can be used to test memory or logic circuitry every time power is applied to the ASIC, thereby allowing an ASIC to be easily tested after it has been incorporated in an end product. A number of software tools exist for automatically generating BIST circuitry, including RAMBIST Builder by LSI Logic of Milpitas, Calif. Such software produces area-efficient BIST circuitry for testing memories, and reduces time-to-market and test development costs.

In the BIST approach, a test pattern generator and test response analyzer are incorporated directly into the device to be tested in the form of a dedicated, hard-wired circuit. BIST operation is controlled by supplying an external clock and employing a simple commencement protocol. BIST test results are typically compressed—usually to the level of "passed" or "failed." At the end of a typical structured BIST test, or "run," a simple pass/fail signal is asserted, indicating whether the device passed or failed the test. Intermediate pass/fail signals may also be provided, allowing individual circuits or groups of circuits to be analyzed. Unlike external testing approaches, at-speed testing with BIST is readily achieved. BIST also alleviates the need for long and convoluted test vectors and may function as a surrogate for functional testing or scan testing. Further, since the BIST structures are hard-wired and remain active on the device, BIST can be employed at the board or system level to yield reduced system testing costs, and to reduce field diagnosis and repair costs.

In addition to the aforementioned testing procedures, manufacturers employ a number of techniques to repair faulty ASICs when feasible. Such techniques include bypassing defective cells using laser procedures and fused links that cause address redirection or data corruption. However, such techniques are limited to one-time repair and require significant capital investment. Further, these techniques may leave ICs useless if the repaired ASICs become defective after shipment from the manufacturing site (perhaps due to electromigration or other burn-in related defects) —even where test equipment is available to end users, traditional field repairs have been expensive, time consuming and largely impracticable.

In order to enhance the repair process, on-chip built-in self repair (BISR) circuitry for repairing faulty memory cells has evolved. BISR circuitry functions internal to the IC without detailed interaction with external test or repair equipment. In the BISR approach, suitable test algorithms are preferably developed and implemented in BIST or BIST-like circuitry. Following execution of the test patterns, the BISR circuitry analyzes the BIST "signature" (results) and, in the event of detected faults, automatically reconfigures the defective memory utilizing redundant memory elements to replace the defective ones. An ASIC incorporating BISR is therefore defect-tolerant. The assignee of the present invention, LSI Logic Corporation, has addressed different methods of repairing faulty memory locations employing BIST and BISR circuitry, as disclosed in U.S. patent application Ser. No. 08/970,030, entitled "Method for Separating Prime and Repaired Integrated Circuits Incorporating Built-in Self Test and Built-in Self Repair Circuitry," which is hereby incorporated by reference as if set forth in its entirety.

BISR compliments BIST because it takes advantage of on-chip processing capabilities to enable only functioning hard macrocells and glue logic, rather than using an expensive and slow laser burning process to try to fix the faulty ones.

During the testing process, it is often desirable to separate so-called "prime die" (IC die in which no redundant BISR memory components were utilized during initial testing) from "repaired die." Separating IC die in this manner provides an indication of quality and fault tolerance. Because the BIST and BISR circuitry of an IC continue to be functional in the field, any BISR redundancy resources not expended during initial testing are available to repair faults that may occur in the field. As a consequence, prime die have a higher degree of fault tolerance, and can often be sold by manufacturers for a premium.

Unfortunately, as stated above, both conventional BIST and BISR circuitry takes the form of hard-wired logic, which invariably occupies chip area that could otherwise be employed by circuitry useful in the normal operation of the ASIC. Further, if the BIST or BISR circuitry itself is manufactured with a fault, its operation may be significantly altered, potentially compromising or prohibiting any test or repair function it would be tasked with performing.

Accordingly, what is needed in the art is a better way to incorporate BIST or BISR capabilities into an ASIC. More specifically, what is needed is an improved BIST or BISR for VLSI or WSI circuitry.

SUMMARY OF THE INVENTION

To address the above-discussed deficiencies of the prior art, the present invention provides an IC (IC) and methods of manufacturing and operating ICs. In one embodiment, the IC includes: (1) a plurality of interchangeable hard macrocells, (2) at least one programmable logic block (PLB), (3) a bus intercoupling the plurality and the at least one PLB and (4) a self-repair program, associated with the at least one PLB, that causes the PLB to test at least some of the plurality and place at least a functioning one of the plurality into an operational status.

The present invention therefore introduces the broad concept of "programmable self-repair," in which a PLB under control of a self-repair program, instead of hard-coded logic, is employed to test IC functionality and selectively enable properly functioning hard macrocells. PLBs are less likely to produce erroneous test results than hard-coded logic. Of course, the "programmable self-repair" of the present invention need not be used alone. It may be employed in combination with conventional ATE, hard-coded logic or both, as desired.

In one embodiment of the present invention, the plurality numbers at least one greater than a required minimum number for operation of the IC. This is so-called "N+1" redundancy. Those skilled in the pertinent art will understand, however, that a greater degree of redundancy may be desired in particular applications.

PLBs are also more flexible than hard-coded logic, allowing them to be potentially reused in another capacity when testing is complete. Thus, in one embodiment of the present invention, the self-repair program is capable of being dissociated from the PLB to allow the PLB to assume a different function in the IC.

In one embodiment of the present invention, the plurality are selected from the group consisting of: (1) random-access memory (RAM), (2) microprocessors, (3) digital signal processors (DSPs) and (4) media access controllers (MACs). Those skilled in the pertinent art will understand, however, that any conventional or later-discovered hard macrocell is within the broad scope of the present invention. A "hard macrocell" is therefore any block of circuitry that can be replicated on a substrate and that is designed to cooperate with other circuitry as part of a larger whole.

In one embodiment of the present invention, the self-repair program causes the PLB to test all of the plurality. In an embodiment to be illustrated and described, the IC comprises more than one plurality of interchangeable hard macrocells, and the self-repair program causes the PLB to test at least some of each of the more than one plurality. Sufficient numbers of functioning hard macrocells are placed into an operational status such that the IC can operate properly.

In one embodiment of the present invention, the self-repair program causes the PLB to employ the bus to test the at least some of the plurality. Alternatively or additionally, the PLB may employ a dedicated test bus to test the at least some.

In one embodiment of the present invention, the circuit further includes memory that stores a signature for subsequent use to place at least the functioning one of the plurality into the operational status, the self-repair program therefore being required only once. In this embodiment, the self-repair program may be executed following manufacture of the IC, or may be executed the first time a customer operates the IC. Thereafter, another program can occupy the PLB. Of course, the self-repair program can function each time power is applied to the IC, and thereafter either remain in the PLB or be supplanted with another program as desired.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
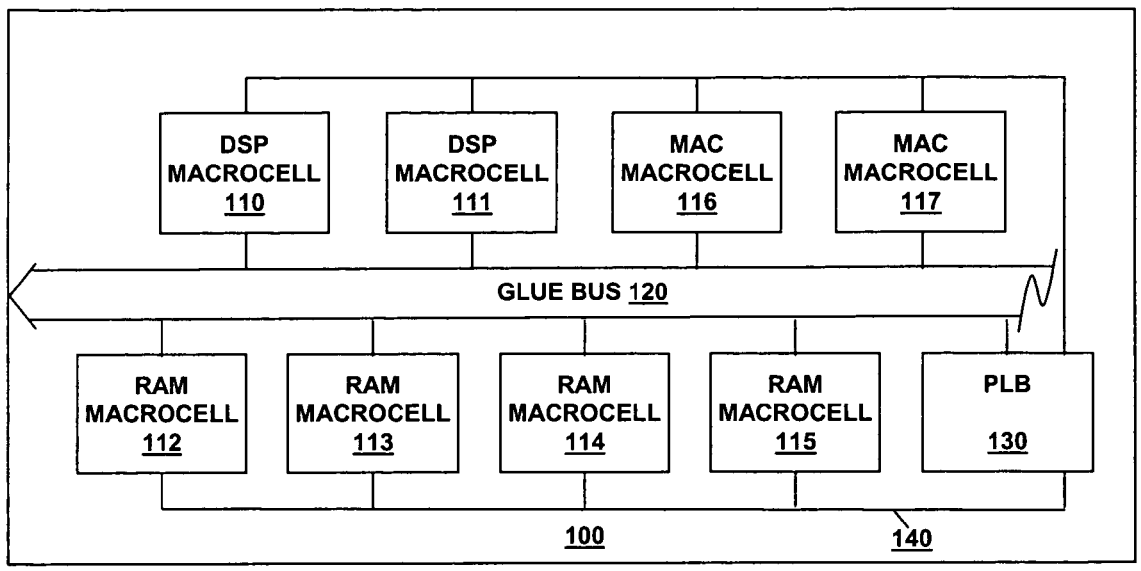
FIG. 1 illustrates a block diagram of a VLSI incorporating a PLB and self-repair program constructed according to the principles of the present invention.

Referring initially to FIG. 1, illustrated is a block diagram of an ASIC, generally designated 100, incorporating a PLB and self-repair program constructed according to the principles of the present invention. Those skilled in the pertinent art should understand that the ASIC 100 could be a WSI. Those skilled in the pertinent art should also understand that the scope of the present invention encompasses ICs of lesser scales of integration than VLSI.

The ASIC 100 is illustrated as including a plurality of hard macrocells 110, 111, 112, 113, 114, 115, 116, 117. The hard macrocells 110, 111 are interchangeable DSP hard macrocells. The hard macrocells 112, 113, 114, 115 are interchangeable RAM hard macrocells. The hard macrocells 116, 117 are interchangeable MAC hard macrocells.

A glue bus 120 interconnects the hard macrocells 110, 111, 112, 113, 114, 115, 116, 117, allowing activated ones of the hard macrocells 110, 111, 112, 113, 114, 115, 116, 117 to communicate with one another to perform the overall function for which the ASIC 100 has been designed.

A PLB 130 is coupled to the glue bus 120. The PLB 130 is a general-purpose PLB. That is, the PLB 130 is designed to operate with various types of programs, and is not limited to operating a single program. More specifically, although the PLB 130 is capable of operating a self-repair program (not shown in FIG. 1), the PLB 130 is fully capable of operating other than self-repair programs. Those skilled in the pertinent art will understand that the ASIC 100 may contain more than one PLB 130 that may be dedicated to operation of the self-repair program of the present invention.

Were fault-tolerance not a concern, the function of the ASIC 100 would require only one DSP hard macrocell (either the hard macrocell 110 or 111), one pair of RAM hard macrocells (any two of the macrocells 112, 113, 114 or 115) and one MAC hard macrocell (either the hard macrocell 116 or 117).

Therefore, the function of the PLB 130, when loaded with a self-repair program and thereafter prompted to begin a self-repair process, is to test the hard macrocells 110, 111, 112, 113, 114, 115, 116, 117 to determine which ones of the hard macrocells 110, 111, 112, 113, 114, 115, 116, 117 are functioning, and to place at least some of the functioning hard macrocells 110, 111, 112, 113, 114, 115, 116, 117 in an operational status. "Operational status" means connected to the glue bus 120 and otherwise enabled when the ASIC 100 is called upon to operate.

The self-repair program may have several alternative goals. If the goal is merely to test, and not to repair (actually a BIST function, instead of a BISR function), the self-repair program may cause the PLB 130 to test the hard macrocells 110, 111, 112, 113, 114, 115, 116, 117 and report their status (pass/fail). As stated above, this report is often called a "signature."

Going a step further, the goal may be to perform self-repair. If this is the goal, the self-repair program need only cause the PLB 130 to find the required number of each type of hard macrocell 110, 111, 112, 113, 114, 115, 116, 117 to render the ASIC 100 operational. Accordingly, the self-repair program causes the PLB 130 to test at least one of the DSP hard macrocells (any one of the hard macrocells 110, 111), at least two of the RAM hard macrocells (any two of the macrocells 112, 113, 114, 115) and at least one of the MAC hard macrocells (any one of the hard macrocells 116, 117). Once the PLB 130 finds a functional DSP hard macrocell, it places that DSP hard macrocell into an operational status, and begins to test the RAM hard macrocells. Once the PLB 130 finds a functional pair of RAM hard macrocells, it places that pair of RAM hard macrocells into an operational status, and begins to test the MAC hard macrocells. Once the PLB 130 finds a functional MAC hard macrocell, it places that MAC hard macrocell into an operational status, and terminates operation.

Going yet a step further, the goal may be to perform self-repair and determine the extent to which the ASIC remains tolerant of further faults. If this is the goal, the self-repair program needs to cause the PLB to test every hard macrocell 110, 111, 112, 113, 114, 115, 116, 117. Accordingly, the self-repair program causes the PLB 130 to test both of the DSP hard macrocells (the hard macrocells 110, 111), all four of the RAM hard macrocells (the macrocells 112, 113, 114, 115) and both of the MAC hard macrocells (the hard macrocells 116, 117). Having completed its testing, the self-repair program can cause the PLB 130 to place any one of the functional DSP hard macrocells into an operational status, any pair of the functional RAM hard macrocells into an operational status and any one of the functional MAC hard macrocells into an operational status. The self-repair program may then cause the PLB 130 to generate a signature indicating the capacity of the ASIC 100 for further fault-tolerance, and thereafter terminate operation.

The self-repair program may be any test or suite of tests appropriate for the hard macrocells that are to be tested. Those skilled in the art are familiar with the manner in which ATE and hard-coded logic can be employed to test hard macrocells. The present invention can employ the same or similar tests in software form within the ASIC 100 to perform the needed tests.

Placing hard macrocells into an operational status typically involves enabling input and output interfaces associated with the selected hard macrocells, such that signals can be routed between the selected hard macrocells and the glue bus 120. The specific manner in which hard macrocells are activated or deactivated is not material to the principles of the present invention.

FIG. 1 also shows a special-purpose self-repair bus 140. The PLB 130, under control of the self-repair program, may employ the self-repair bus 140 to gain access to one or more of the hard macrocells 110, 111, 112, 113, 114, 115, 116, 117. Use of the self-repair bus 140 may be preferable to use of the glue bus 120 for several reasons. The self-repair bus 140 may have access to portions of the hard macrocells 110, 111, 112, 113, 114, 115, 116, 117 or I/O pins (not shown) to which the glue bus 120 does not. Alternatively or additionally, the bandwidth of the self-repair bus 140 may exceed that of the glue bus 120. Alternatively or additionally, the glue bus 120 may be preoccupied with other tasks, and therefore not sufficiently available for the process of self-repair.

Figure 2:
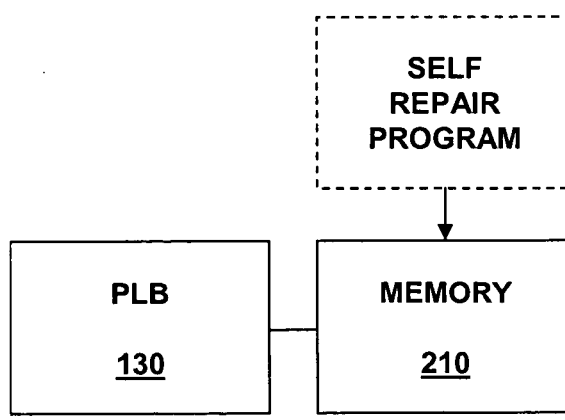
FIG. 2 illustrates a block diagram of the PLB and self-repair program of FIG. 1.

Turning now to FIG. 2, illustrated is a block diagram of the PLB 130 and self-repair program of FIG. 1. As previously described, the PLB 130 is capable of operating more than a self-repair program, and thus is not hard-wired for just that purpose. The PLB 130 has an associated memory 210. The memory 210 contains the self-repair program and may later contain another program that is to govern operation of the PLB 130 subsequently. The memory 210 may be a read-only memory (ROM) or RAM of any conventional or later-discovered type.

Figures 3, 4:
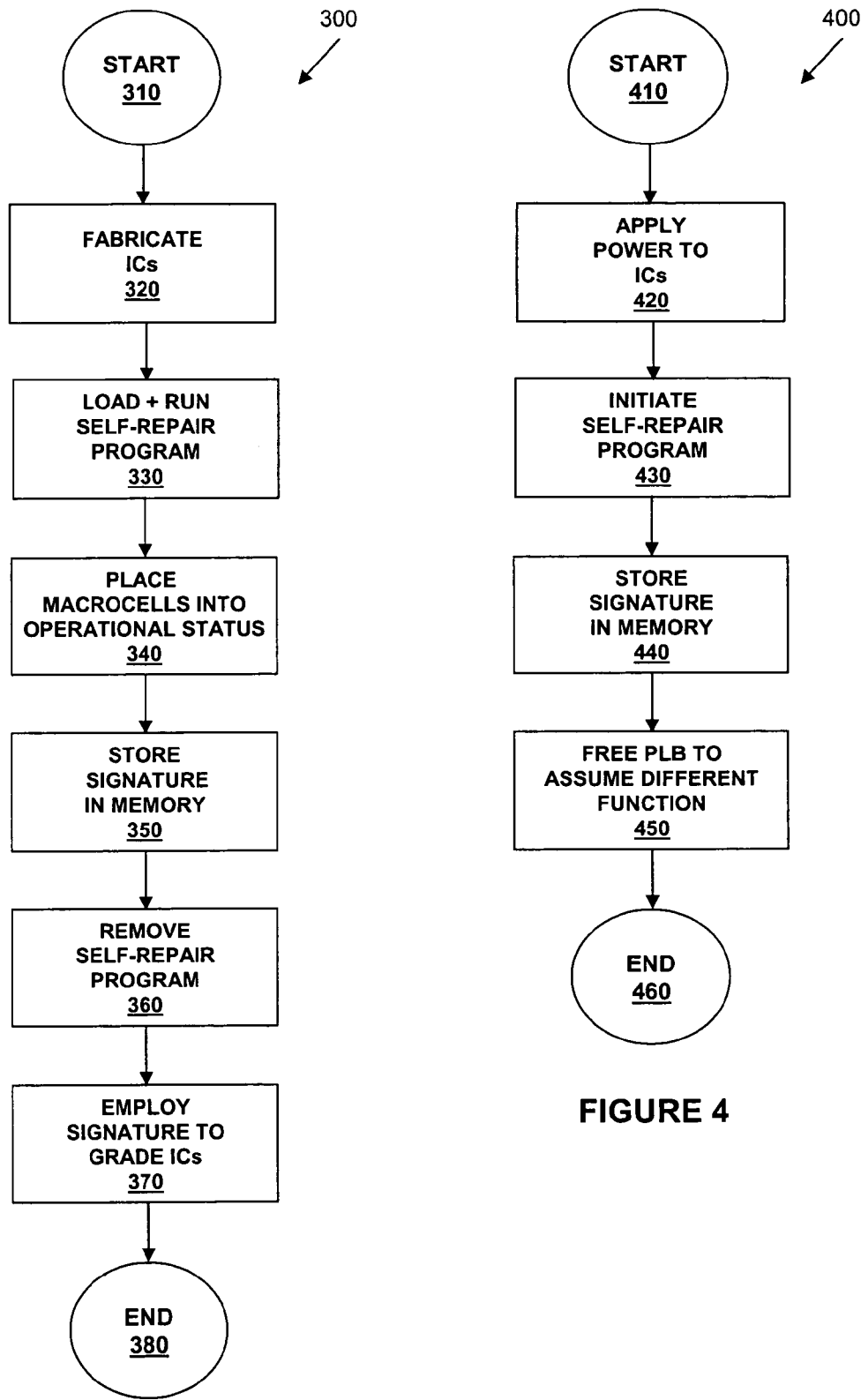
FIG. 3 illustrates a flow diagram of a method of manufacturing an IC carried out according to the principles of the present invention.
FIG. 4 illustrates a flow diagram of a method of operating an IC carried out according to the principles of the present invention.

Turning now to FIG. 3, illustrated is a flow diagram of a method, generally designated 300, of manufacturing an IC carried out according to the principles of the present invention. The method 300 begins in a start step 310, wherein ICs (perhaps VLSI or WSI ASICs) are desired to be fabricated. In such case, a plurality of ICs, each including at least: a plurality of interchangeable hard macrocells, a PLB and a bus, intercoupling the plurality of hard macrocells and the PLB, are fabricated in a step 320. Next, in a step 330, a self-repair program is loaded into the PLB and begins to cause the PLB to test at least some of the plurality of hard macrocells. (Alternatively, the self-repair program may cause the PLB to test all of the plurality of hard macrocells.)

The PLB may use the glue bus, the optional self-repair bus or both buses as a particular application may require.

Next, based on the results of the test, the PLB (under control of the self-repair program) places at least a functioning one of the plurality of hard macrocells into an operational status in a step 340. Next, in an optional step 350, the results of the test may be stored in a memory to allow subsequent use of the signature to place at least the functioning ones of the plurality into operational status. This allows the self-repair program to be removed from the ASIC if such is desired (in an optional step 360). Then, in an optional step 370, the signature may be employed to grade the plurality of ICs based on a degree of fault-tolerance. Premium ICs (those with the highest fault-tolerance) may be sold at a higher price than those having less fault-tolerance. The method 300 ends in an end step 380.

Turning now to FIG. 4, illustrated is a flow diagram of a method, generally designated 400, of operating an IC carried out according to the principles of the present invention. The method 400 begins in a start step 410, wherein an IC (perhaps VLSI or WSI ASIC) is desired to be operated. In such case, power is applied to an IC including at least: a plurality of interchangeable hard macrocells, a PLB and a bus, intercoupling the plurality of hard macrocells and the PLB, in a step 420.

Next, in a step 430, a self-repair program, associated with the PLB, is initiated to cause the PLB to test at least some of the plurality of hard macrocells and place at least a functioning one of the plurality into an operational status. (Again, the PLB, under control of the self-repair program, may test all of the plurality of hard macrocells, and the PLB may use the glue bus, the optional self-repair bus or both buses as a particular application may require.)

Then, in an optional step 440, a signature representing the results of the test may be stored into memory (allowing the signature thereafter to be retrieved to place at least the functioning ones of the plurality of hard macrocells into the operational status). If the optional step 440 is undertaken, the PLB is free to assume a different function in the IC in a step 450. The method ends in a step 460.

Although the present invention has been described in detail, those skilled in the art should understand that they can make various changes, substitutions and alterations herein without departing from the spirit and scope of the invention in its broadest form.

What is claimed is:

1. An integrated circuit, comprising:
   a plurality of redundant hard macrocells;
   at least one programmable logic block;
   a bus intercoupling said plurality of macrocells and said at least one programmable logic block; and
   a self-repair program, associated with said at least one programmable logic block, that causes said at least one programmable logic block to test at least some of said plurality of macrocells and place at least a functioning one of said plurality of macrocells into an operational status.

2. The circuit as recited in claim 1 wherein said plurality of macrocells numbers at least one greater than a required minimum number for operation of said integrated circuit.

3. The circuit as recited in claim 1 wherein said self-repair program is capable of being dissociated from said at least one programmable logic block to allow said at least one programmable logic block to assume a different function in said integrated circuit.

4. The circuit as recited in claim 1 wherein said plurality of macrocells are selected from the group consisting of:
   random-access memory,
   microprocessors,
   digital signal processors, and
   media access controllers.

5. The circuit as recited in claim 1 wherein said self-repair program causes said at least one programmable logic block to test all of said plurality of macrocells.

6. The circuit as recited in claim 1 wherein said self-repair program causes said at least one programmable logic block to employ said bus to test said at least some of said plurality of macrocells.

7. The circuit as recited in claim 1 further comprising memory that stores a signature for subsequent use to place at least said functioning one of said plurality of macrocells into said operational status, said self-repair program therefore being required only once.

8. A method of manufacturing integrated circuits, comprising:
   fabricating a plurality of integrated circuits, each of said integrated circuits including:
      a plurality of redundant hard macrocells,
      at least one programmable logic block, and
      a bus intercoupling said plurality of macrocells and said at least one programmable logic block;
   loading a self-repair program into said at least one programmable logic block to cause said at least one programmable logic block to test at least some of said plurality of macrocells and place at least a functioning one of said plurality of macrocells into an operational status; and
   employing said self-repair program to grade said plurality of integrated circuits based on a degree of fault-tolerance.

9. The method as recited in claim 8 wherein said plurality of macrocells numbers at least one greater than a required minimum number for operation of said integrated circuit.

10. The method as recited in claim 8 wherein said self-repair program is capable of being dissociated from said at least one programmable logic block to allow said at least one programmable logic block to assume a different function in said integrated circuit.

11. The method as recited in claim 8 wherein said plurality of macrocells are selected from the group consisting of:
   random-access memory,
   microprocessors,
   digital signal processors, and
   media access controllers.

12. The method as recited in claim 8 wherein said self-repair program causes said at least one programmable logic block to test all of said plurality of macrocells.

13. The method as recited in claim 8 wherein said self-repair program causes said at least one programmable logic block to employ said bus to test said at least some of said plurality of macrocells.

14. The method as recited in claim 8 further comprising providing a memory that stores a signature for subsequent use to place at least said functioning one of said plurality of macrocells into said operational status, said self-repair program therefore being required only once for each of said plurality of integrated circuits.

15. A method of operating an integrated circuit, comprising:
   applying power to a plurality of hard macrocells, at least one programmable logic block and a bus, intercoupling said plurality of redundant macrocells and said at least one programmable logic block, that comprise said integrated circuit; and initiating a self-repair program, associated with said at least one programmable logic block, that causes said at least one programmable logic block to test at least some of said plurality of macrocells and place at least a functioning one of said plurality of macrocells into an operational status.

16. The method as recited in claim 15 wherein said plurality of macrocells numbers at least one greater than a required minimum number for operation of said integrated circuit.

17. The method as recited in claim 15 further comprising subsequently dissociating said self-repair program from said at least one programmable logic block to allow said at least one programmable logic block to assume a different function in said integrated circuit.

18. The method as recited in claim 15 wherein said plurality of macrocells are selected from the group consisting of:

random-access memory,
microprocessors,
digital signal processors, and
media access controllers.

19. The method as recited in claim 15 wherein said initiating comprises causing said at least one programmable logic block to test all of said plurality of macrocells.

20. The method as recited in claim 15 wherein said initiating comprises causing said at least one programmable logic block to employ said bus to test said at least some of said plurality of macrocells.

21. The method as recited in claim 15 further comprising:
storing data into memory; and
retrieving said data subsequently to place at least said functioning one of said plurality of macrocells into said operational status, said initiating being carried out only once.

* * * * *